United States Patent [19]

Bechard et al.

[11] 4,028,798

[45] June 14, 1977

[54] METHOD OF MAKING ELECTRICAL CONNECTIONS

[75] Inventors: Conrad E. Bechard, Chagrin Falls; John M. Davenport, Euclid; William H. Herrmann, East Cleveland; Steven N. Lovrekovic, Cleveland, all of Ohio

[73] Assignee: General Electric Company, Schenectady, N.Y.

[22] Filed: Apr. 9, 1976

[21] Appl. No.: 675,617

[52] U.S. Cl. .............................. 29/628; 156/73.2; 228/110; 361/400
[51] Int. Cl.² ........................................ H01R 43/00
[58] Field of Search ................. 29/628, 625, 624; 228/110, 1, 4.5, 15.1, 44.1, 904, 180 A; 156/166, 73.1, 73.2, 380, 580, 581, 583, 323; 174/68.5; 317/101 B, 101 C, 101 CC, 101 CE; 219/209, 210

[56] References Cited

UNITED STATES PATENTS

| 3,300,851 | 1/1967 | Lodder | 228/110 |
| 3,384,958 | 5/1968 | Christian et al. | 29/628 |
| 3,674,602 | 7/1972 | Keogh et al. | 156/380 |
| 3,883,213 | 5/1975 | Glaister | 339/61 M |
| 3,894,226 | 7/1975 | Hanson | 240/1.3 |

*Primary Examiner*—James R. Duzan
*Attorney, Agent, or Firm*—Norman C. Fulmer; Lawrence R. Kempton; Frank L. Neuhauser

[57] ABSTRACT

A wire is positioned alongside a plastic member which carries a conductor, and a portion of the wire is driven sideways into the plastic so that the wire engages against the conductor and is held in place by embedment in the plastic. The wire may be driven into the plastic by a heated tool or by ultrasonic vibration. A particular use of the invention is the connection of wires to circuit runs of printed circuit boards, such as in the FlipFlash photoflash array.

20 Claims, 10 Drawing Figures

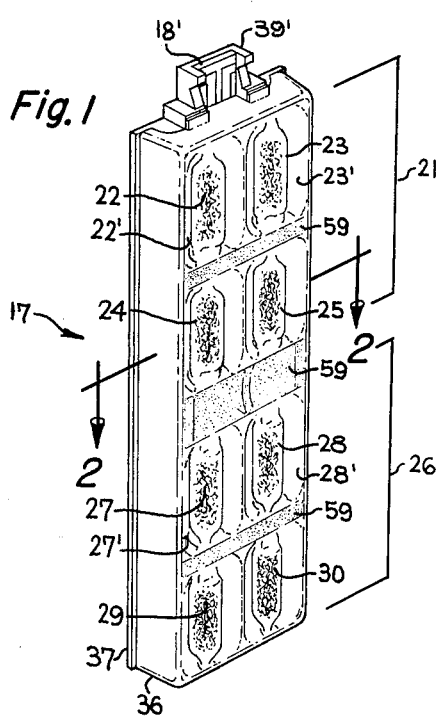
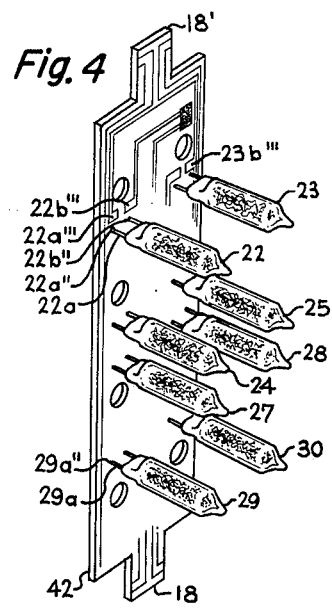
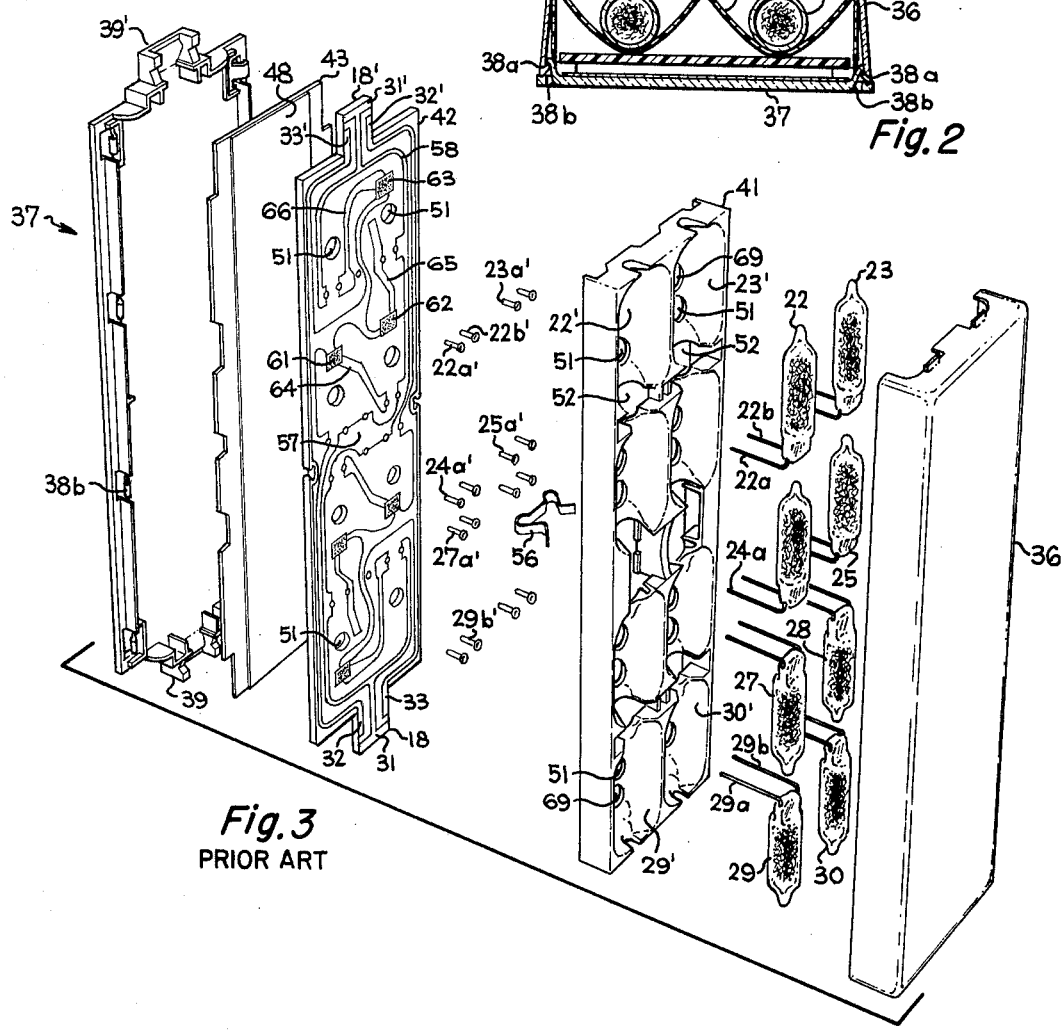
Fig. 1
Fig. 4
Fig. 2
Fig. 3
PRIOR ART

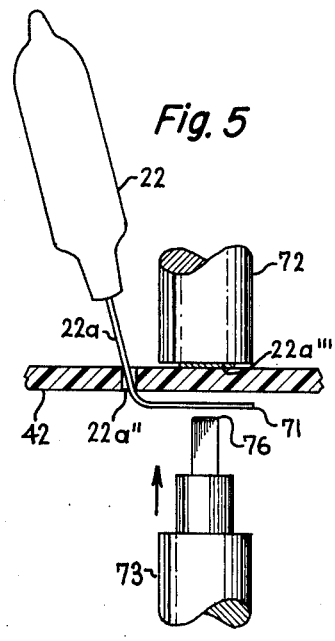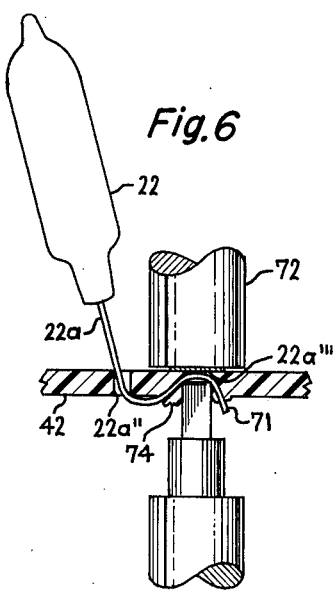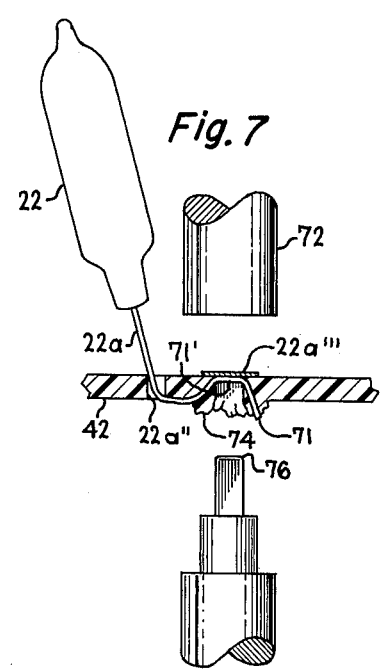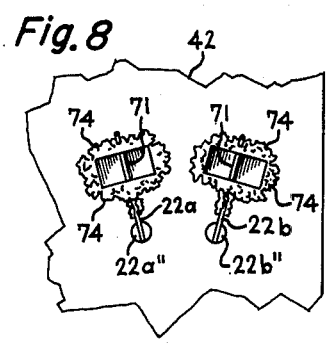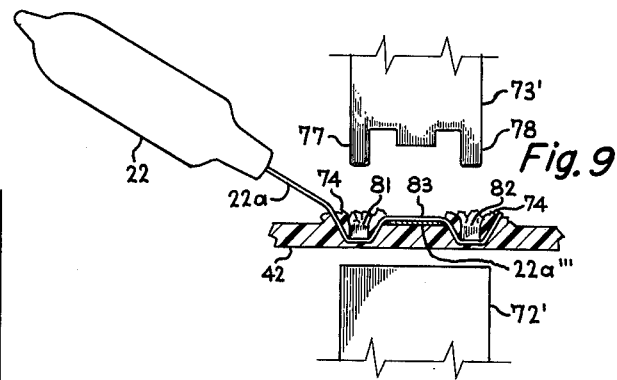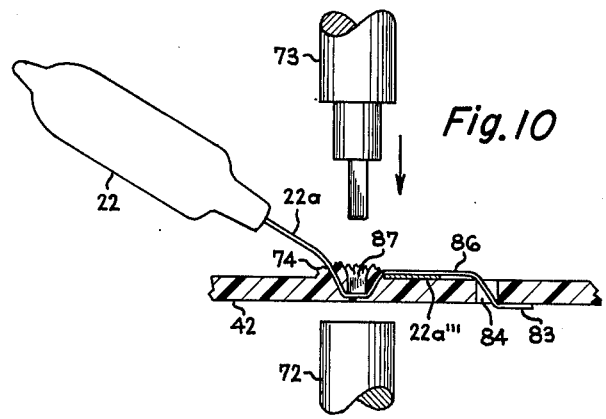

METHOD OF MAKING ELECTRICAL CONNECTIONS

CROSS-REFERENCES TO RELATED APPLICATIONS

Ser. No. 509,822, filed Sept. 27, 1974, Bolon et al, "Radiation Curable Inks," now U.S. Pat. No. 3,968,056 and assigned the same as the present invention.

Ser. No. 509,823, filed Sept. 27, 1974, Bolon et al, "Radiation Curable Inks," now U.S. Pat. No. 3,989,644 and assigned the same as the present invention.

Ser. No. 509,824, filed Sept. 27, 1974, Bolon et al, "Radiation Curable Inks," now U.S. Pat. No. 3,957,694 assigned the same as the presen invention.

Ser. No. 509,893, filed Sept. 27, 1974, Bolon et al, "Method for Making a Circuit Board and Article Made Thereby," now U.S. Pat. No. 3,988,647 assigned the same as the present invention.

BACKGROUND OF THE INVENTION

The invention is in the field of making electrical connections of wires and/or conductors, such as attaching wires to circuit runs of printed circuit boards.

Many methods have been used for interconnecting wires and/or conductors, such as twisting, soldering, welding, and by means of ultrasonic vibration bonding, and by means of fasteners such as screws, clamps, ferrules, rivets, and eyelets. The invention will be specifically described with respect to the attachment of photoflash lamp lead-in wires to circuit runs on a circuit board for use in the FlipFlash photoflash array. U.S. Pat. No. 3,935,442 to James M. Hanson describes a FlipFlash array construction in which the 16 lead-in wires of eight flash lamps of the array are connected to a circuit board by means of 16 eyelets. The eyelets are inserted in holes in the circuit board located so that the heads of eyelets engage against circuit runs on the board. The flash lamp lead-in wires are inserted in the respective eyelets which are then crimped or bent to hold the wires and make electrical contact. In view of the quantity (millions) of FlipFlash arrays that are manufactured, the cost of the eyelets is substantial.

The above-referenced patent applications disclose types of circuit boards for which the present invention is particularly useful.

SUMMARY OF THE INVENTION

Objects of the invention are to provide an economical and feasible method of connecting a wire or elongated conductor to a conductive member carried by a member of plastic or other suitable electrically insulative material.

The invention comprises, briefly and in a preferred embodiment, the method of connecting an elongated electrical conductor to a conductive member carried by a plastic member, comprising the steps of positioning the elongated conductor alongside the plastic member, and driving and forming one or more portions of the elongated conductor sideways into the plastic member so that the conductor engages against the conductive member and is held in place by embedment in the plastic member. The driving means may be a heated tool or an ultrasonic vibrating tool, or other suitable means. In one embodiment, a wire is attached to a circuit run carried on one side of a circuit board, by positioning a portion of the wire alongside the other side of the circuit board and driving it sideways through the board and against the underside of a circuit run. The wire may be formed so as to have an elongated portion thereof in contact with the circuit run. The wire is permanently held in place by a flow of the board material against and around the wire which occurs while the wire is being driven into the board. In another embodiment, the wire to be attached is placed across a circuit run or conductor carried by a deformable member, and two portions of the wire flanking the conductor are embedded in the deformable member so that the intermediate portion of the wire is held in electrical contact against the conductor. In a modification, a first portion of the wire at an end thereof is hooked through an opening in the deformable carrier member, a second portion of the wire adjacent to the first portion thereof is positioned across the conductor carried by the carrier member, and a third portion of the wire adjacent to its second portion is embedded in the deformable member so that the second portion of the wire is held in electrical contact against the conductor.

The foregoing methods are useful for a variety of types of deformable carrier members (such as electrically insulative plastic material), conductors carried by the carrier member, and wires or metal strips, etc., which are to be electrically connected to the conductors. A particularly useful application for the invention is in connecting wires to circuit runs carried by a circuit board. For example, in the FlipFlash photoflash array, there are eight flash lamps having a total of 16 lead-in wires which must be electrically connected to various circuit runs carried by a circuit board. As is described above, this has been done by using eyelets, which adds to the manufacturing cost not only the cost of the eyelets but also the assembly costs of inserting the eyelets into the circuit board, inserting the lamp lead-in wires into the eyelets, and crimping or bending the eyelets. By the method of the present invention, the flash lamp lead-in wires are attached to the circuit board quickly, economically, and without using eyelets.

In a preferred method of connecting flash lamp lead-in wires to a circuit board carrying circuit runs on one side thereof, in accordance with the invention, the lead-in wires are inserted through openings in the board from the circuit-carrying side, and are positioned adjacent to the other side of the board in alignment with respective circuit runs to which connections are desired. A portion of each of the lead-in wires is driven sideways into and through the board so as to engage against the underside of a desired circuit run and is held in place by embedment in the board material. The wire-driving means can be, for example, an ultrasonically vibrating tool or a heated tool. One, some, or all of the lead-in wires can be thus securely attached (both mechanically and electrically) to the circuit board simultaneously, the number of possible simultaneous wire connections being primarily determined by the attachment machinery design and capability.

BRIEF DESCRIPTION OF THE DRAWINGS

FIG. 1 is a perspective view of a multiple flash lamp array.

FIG. 2 is a sectional view taken on the line 2—2 of FIG. 1.

FIG. 3 is an exploded view of the array of FIG. 1 showing a prior type of construction using eyelets for attaching the flash lamps to a circuit board.

FIG. 4 is a perspective view of a circuit board having flash lamps attached thereto in accordance with an embodiment of the invention.

FIGS. 5, 6, and 7 illustrate steps in the method of attaching lamp lead-in wires to the circuit board of the embodiment shown in FIG. 4.

FIG. 8 is a view of a portion of the non-circuit side of the circuit board of FIG. 4.

FIGS. 9 and 10 illustrate alternative embodiments of the invention.

DESCRIPTION OF THE PREFERRED EMBODIMENTS

A multiple flash lamp unit 17 of the planar array type and containing a plurality of electrically fired flash lamps is provided with a plug-in connector tab 18 at the lower end thereof, adapted to fit into a socket of a camera or flash adapter as shown and described in patent applications referenced in above-referenced Hanson patent. The lamp array 17 is provided with a second plug-in connector tab 18' at the top end thereof, whereby the array 17 is adapted to be attached to the camera socket in either of two orientations, i.e., with either the tab 18 or the tab 18' plugged into the socket. The array 17 is provided with an upper group 21 of flash lamps 22, 23, 24, and 25, and a lower group 26 of flash lamps 27, 28, 29, and 30, the lamps being arranged in a planar configuration. Reflectors 22', etc., are disposed behind the respective flash lamps, so that as each lamp is flashed, its light is protected forwardly of the array 17. The lamps are arranged and connected so that when the array is connected to a camera by the connector 18, only the upper group 21 of lamps will be flashed, and when the array is turned end for end and connected to the camera by the other connector 18', only the then upper group 26 of lamps will be flashed. By this arrangement, only lamps relatively far from the lens axis are flashable, thus reducing the undesirable red-eye effect, as is more fully described in the above-referenced patent applications.

The general construction of the arrays, also disclosed in the above-referenced Hanson patent, comprises front and back housing members 36 and 37, which preferably are made of plastic and are provided with interlocking members 38 which can be molded integrally with the housing members and which lock the housing members together in final assembly to form a unitary flash array structure. FIG. 2 shows a pair of interlocking members 38a carried at the rear of the side of the front housing member 36 interlocked with a pair of interlocking members 38b of the back housing member 37. In the preferred embodiment shown, the front housing member 36 is a rectangular concavity and the back housing member 37 is substantially flat and includes integral extensions 39 and 39' at the ends thereof which partly surround and protect the connector tabs 18 and 18' and also function to facilitate mechanical attachment to the camera socket. Sandwiched between the front and back housing members 36 and 37, in the order named, are the flash lamps 22, etc., a unitary reflector member 41 (preferably of aluminum-coated plastic) shaped to provide the individual reflectors 22', etc., a printed circuit board 42 provided with integral connector tabs 18 and 18', and an indicia sheet 43 which may be provided with instructions, information, and other indicia such as flash indicators as described in the above-referenced Hanson patent. Openings 51 are provided through the reflector unit 41 and the circuit board 42 to facilitate radiation from flashing lamps reaching a flash indicator sheet 48 which changes color behind a flashed lamp. The rear housing member 37 is transparent (either of clear material or provided with window openings) to permit viewing of the indicia on the indicia sheet 43. The front housing member 36 is transparent at least in front of the lamps 22, etc., to permit light from flashing lamps to emerge frontwardly of the array, and may be tinted to alter the color of light from the flash lamps.

The height and width of the rectangular array are substantially greater than its thickness, and the heights and widths of the reflector member 41 and circuit board 42 are substantially the same as the interior height and width of the housing member 36, to facilitate holding the parts in place.

The tab 18, which is integral with the circuit board 42, is provided with a pair of electrical terminals 31 and 32, and similarly the tab 18' is provided with a pair of terminals 31' and 32', for contacting terminals of a camera socket for applying firing voltage pulses to the array. Each tab is provided with a third terminal 33 and 33', respectively, which functions to electrically short the circuitry of the inactive lower group of lamps when the array is plugged into a socket. The terminals 31 and 31' are shown as having a lateral "T-bar" configuration for temporarily shorting the socket terminals while the array is being plugged in, to discharge any residual voltage charge in the firing pulse source and also to reduce the likelihood of lamps being accidentally flashed by electrostatic voltage when the array is handled.

The circuit board 42 has a "printed circuit" thereon, as will be described, for causing sequential flashing of the lamps by firing voltage pulses applied to the terminals 31, 32 or 31', 32'. The top and bottom halves of the printed circuitry preferably are reverse mirror images of each other. In accordance with prior art, the lead wires 22a, 22b, etc., of the lamps 22, etc., may be attached to the circuit board 42 by means of metal eyelets 22a', 22b', etc., placed through openings in the board. The lead wires 22a, 22b, etc., pass through openings 52 in the reflector member 41 and into or through the respective pairs of eyelets 22a', 22b', etc., and the ends of the eyelets are crimped or bent to hold the lead wires and make electrical contact thereto and also to hold the eyelets in place with their heads in electrical contact with the circuit of the circuit board.

A metal clip 56 is clipped onto the reflector member 41, which reflector preferably is made of metal-coated plastic, and the rear of the clip 56 rests in touching contact against an area 57 of an electrical ground circuit run 58 on the board and which includes the terminals 31 and 31' and which makes contact with one of the connector eyelets 22a' or 22b', etc., for each of the lamps 22, etc., whereby the reflector unit 41 additionally functions as an electrically grounded shield.

Areas 59 on the transparent front housing member 36 may be made opaque or partly opaque, such as by making the surface roughened at these areas, to fully or partly conceal the lamp lead-in wires 22a, 22b, etc., and/or the lower portions of the lamps, for improved appearance of the array.

The circuit board terminal 32 is part of a conductor run that is electrically connected to lead-in wire 24a of lamp 24 at the eyelet 24a' and terminates at radiation switches 61, 62, and 63 respectively positioned near lamps 24, 25, and 23. A circuit board conductor run 64 is connected electrically to the remaining lead wire of flash lamp 25 at eyelet 25a' and terminates at the radiation switch 61. A circuit board conductor run 65 is connected to the remaining lead-in wire of flash lamp 23 at eyelet 23a' and terminates at the radiation switch 62. Similarly, a circuit board conductor run 66 is connected to the remaining lead-in wire of flash lamp 22 at eyelet 22b' and terminates at radiation switch 63.

The radiation switches 61, 62, and 63 are respectively in contact with and bridge across the circuit runs that are connected to them. The material for the radiation switches may be suitable material initially having an open circuit or high resistance, the resistance thereof becoming zero or a low value when the material receives radiation in the form of heat and/or light from a respective adjacent lamp, upon the lamp being flashed. For this purpose, each of the radiation switches is respectively positioned behind and near to a flash lamp 24, 25, 23. Windows in the form of transparent sections or openings 69 may be provided in the reflectors in front of the switches as shown in FIG. 3 to facilitate radiation transfer. A suitable material for the radiation switches is silver oxide dispersed in a binder such as polyvinyl resin. Each of these radiation switches, upon receiving heat and/or light radiation from the adjacent lamp when it is flashed, changes from an open circuit or high resistance to a closed circuit or low resistance between its switch terminals on the circuit board.

As has been explained, the lower portion of the circuit board contains a substantially reverse mirror image of the same circuit shown in the upper part of the circuit board, and therefore will not be described in detail.

The circuit on the circuit board 42 functions as follows. Assuming that none of the four lamps in the upper half of the unit 17 have been flashed, upon occurrence of a first firing pulse applied across the terminals 31, 32, this pulse will be directly applied to the lead-in wires of the first-connected flash lamp 24, whereupon the lamp 24 flashes and becomes an open circuit between its lead-in wires. Heat and/or light radiation from the flashing first lamp 24 causes the adjacent radiation switch 61 to become a closed circuit (or a low value of resistance), thereby connecting the circuit board terminal 32 electrically to the lead-in wire of the second lamp 25 at eyelet 25a'. By the time this occurs, the firing pulse has diminished to a value insufficient to cause the second lamp 25 to flash. When the next firing pulse occurs, it is applied to the lead-in wires of the second lamp 25, via the now closed radiation switch 61, whereupon the second lamp 25 flashes, thereby causing radiation switch 62 to assume zero or low resistance, and the second lamp 25 now has an open circuit or high resistance between its lead-in wires. When the next firing pulse occurs, it is applied via now closed radiation switch 62 to the third lamp 23, thereby firing the lamp which becomes an open circuit, and the radiation from it causes the radiation switch 63 to become essentially a closed circuit across its terminals. Thus, the next firing pulse will be applied, via now closed radiation switch 63, to the lead-in wires of the fourth flash lamp 22, thereupon causing the lamp to flash. Since this lamp is the last lamp in the active circuit, it does not matter whether its lead-in wires are an open or closed circuit after flashing. Additional flash lamps, radiation switches, and electrical conductors can be employed, if desired, using the just described principles. When the flash unit is turned around the other connector tab 18' attached to the camera socket, the group of lamps that then become uppermost and relatively farthest away from the lens axis will be in an active circuit and will be flashed in the same manner as has been described. In a preferred embodiment, the lamps 22, etc., are high voltage types, requiring about 1000 volts for example, at low current, for flashing, and they can be fired by impacting or stressing a piezoelectric element in the camera, as disclosed in U.S. Pat. Nos. 2,972,937 and 3,106,080 to C. G. Suits.

In accordance with the present invention, the lead-in wires of the flash lamps are attached to the circuit board by an improved and economical method which eliminates the need for the eyelets 22a', 22b', etc. In one embodimment of the invention, shown in FIG. 4, the assembly of flash lamps 22, 23, etc., and circuit board 42 is made by the method of providing pairs of openings 22a'', 22b'', etc., through the circuit board 42 at or adjacent to the pairs of circuit run areas 22a''', 22b''', etc., to which the pairs of lamp lead-in wires 22a, 22b, etc., are to be connected. The lamps may be connected to the circuit board either before or after the reflector member 41 is placed in position. FIGS. 5, 6, and 7 show the steps of attaching a lamp 22 to the circuit board 42, the rest of the lamp being similarly attached simultaneously with lamp 22, or one or more lamps may be attached at a time. The lead-in wires 22a and 22b of lamp 22 are inserted through the openings 22a'' and 22b'' in the circuit board from the side of the board carrying the circuit run connection areas 22a''' and 22b''', as shown in FIG. 5, and the end regions 71 of the lead-in wires are positioned alongside the other side of the circuit board in alignment with the connection areas 22a''' and 22b''' as illustrated in FIG. 5. One or more anvils 72 or other suitable support means are positioned against the circuit board connection areas 22a''', 22b''', etc. (or, vice versa, the circuit board is positioned against the anvils), and a wire-embedding tool 73 is moved to force and drive at least a portion of the end regions 71 into the board 42 and against the undersides of the connector areas 22a''', 22b''', etc., as shown in FIG. 6, and to cause the material of the board 42 to flow around at least part of the end regions of the wires so as to mechanically hold the wires and keep them in electrical contact with the circuit board conductor areas. FIGS. 6, 7, and 8 show the ridges 74 of board material (plastic, for example) which have been created by a flowing of the material due to penetration of the tool 73 and which surround and embed the wires. Thus, secure and reliable electrical and mechanical connections are made between the wires and the circuit board.

The embedding tool 73 can be an ultrasonic vibrating tool, ultrasonic vibrating techniques being well known. The correct depth of penetration of the tool 73 into the board 42 can be measured and determined by force, pressure, time and/or distance, etc. The tool 73 can be heated in addition to, or in lieu of, vibrating in order to cause the board material to flow and hold the wires in electrical contact with the circuit board conductors. The conductor contact areas can be carried by the board in different ways; they need not be on a surface of the board; they can be embedded or contained within the board. The edges 76 of the embedding tool 73 preferably are rounded slightly so as not to cut through the embedded wire regions 71. The embedding end of the tool 73 may have a rectangular cross section as indicated in FIG. 8, or square, circular, or other suitable shape. The wire 71 preferably extends beyond opposed edges of the end of the tool 76, as shown, so that it becomes embedded and held at two places, i.e., at opposed sides or edges of the opening formed by the tool in the plastic. The embedding end, or driving surface, of the tool 73, preferably is substantially flat as shown so as to form the wire 71 into an elongated straight portion 71' which engages against the circuit board conductor over a finite length as shown in FIG. 7, thus increasing the area and reliability of electrical contact. Separate individual driving tool 73 can be employed for embedding several wires simultaneously, or a single tool can be provided with a plurality of driving heads or shanks for simultaneously embedding a plurality of wires into the board.

In the embodiment of FIG. 9, the wires 22a, etc., are positioned over and across the circuit board conductor areas 22a''', etc., and the embedding tool 73' is shaped to have two shanks for each wire to be connected, which are positioned to drive the wire into the board 42 at two places 81, 82 flanking the conductor area so as to cause the board material to flow and embed and hold the wire, as indicated by the numerals 74, at the two places of embedment flanking the conductor area, whereby the portion 83 of the wire intermediate its embedded portions is held in electrical contact against the circuit board conductor area 22a'''. In this embodiment, the supporting anvil is placed against the side of the board 42 opposite the side carrying the contact area. The embedding of the wires at 81 and 82 can be done separately or simultaneously or a plurality of these double embedments can be performed simultaneously. The locations 81 and 82 of embedment can be immediately adjacent to, or against, the edges of the conductor area 22a''', or spaced therefrom, or one or both embedment locations can be through openings in the conductor area 22a'''. Generally, close positioning of the wire embedments 81, 82 to the edges of the conductor areas 22a''', etc., will insure more secure and reliable electrical connections.

The embodiment of FIG. 10 is like that of FIG. 9 except that first regions 83 of the wires 22a, etc., near the ends thereof are bent as shown and hooked through respective openings 84 in the board 42, with a second region 86 of the wires lying across the conductor areas 22a''', etc., and a single embedment 87 is made of the wire into the circuit board across each conductive area from the respective opening 84. Either or both of the openings 84 and embedment 87 can be through the conductive area 22a''', etc., or adjacent to or spaced from its edges.

As is explained above, the invention is particularly useful in attaching wires to conductors of a circuit board, such as attaching lead-in wires of flash lamps to a circuit board. The invention also is useful for attaching a variety of types of wires, strips, and the like to a conductor carried by a deformable insulative member such as being carried on its surface or embedded within it.

The above-referenced patent applications disclose circuit boards carrying the circuit runs in the form of electrically conductive particles held in place by a binder material. Connection wires cannot be readily attached to such particulated types of circuit runs by conventional techniques such as soldering, welding, and ultrasonic bonding, because the particle arrangement is not as solid and unyielding as, for example, a conventional solid copper circuit run. In other words, the particles can shift or flow when heated or subjected to undue mechanical stress, thereby breaking and interrupting the numerous interparticulate physical contacts which provide electrical continuity of the circuit runs. The present invention, however, achieves satisfactory electrical contact between a wire or other elongated conductor and a particulate type of circuit run because the wire, etc., can be brought into contact against, or embedded into, the circuit run particles without mechanically disturbing or displacing the particles to the extent of destroying the desired interparticulate physical contacts which provide electrical continuity of the circuit run conductor.

While preferred embodiments and modifications of the invention have been shown and described, various other embodiments and modifications thereof will become apparent to persons skilled in the art, and will fall within the scope of the invention as defined in the following claims.

What we claim as new and desire to secure by Letters Patent of the United States is:

1. A method of connecting an elongated conductive member to a conductor carried by an insulative member, comprising the steps of positioning said conductive member alongside said insulative member in alignment with said conductor, and driving and bending one or more portions of the conductive member sideways into the insulative member to cause the conductive member to engage against and make electrical contact with said conductor and to be embedded and held in position by flow and subsequent solidification of material of the insulative member around said conductive member at one or more regions thereof.

2. A method as claimed in claim 1, in which said conductive member is driven into the insulative member by means of a tool member having a driving surface which engages against a portion of said conductive member for driving and bending it into the insulative material, said driving surface forming an opening in said insulative material and causing said material to deform at the edges of said opening so as to flow around and embed at least one of said regions of the conductive member, and thereafter withdrawing said tool member from said opening.

3. A method as claimed in claim 2, in which said tool member is vibrated at an ultrasonic frequency.

4. A method as claimed in claim 2, in which said tool member is heated.

5. A method as claimed in claim 2, in which said elongated conductive member extends beyond opposed edges of said driving surface of the tool member so as to become embedded at two regions thereof in opposed deformed edge regions of said opening.

6. A method as claimed in claim 2, in which said driving surface of the tool member comprises a substantially flat area which forms said portion of the conductive member into a substantially straight elongated configuration in contact with said conductor.

7. A method as claimed in claim 1, in which said conductor comprises a plurality of conductive particles held by a binder and providing conductivity in said conductor by means of interparticulate physical contacts, said elongated conductive member being driven so as to become embedded in said particles of the conductor.

8. A method as claimed in claim 1, in which said insulative member comprises first and second opposed surfaces, said conductor being carried on said first surface, and said elongated conductive member being positioned alongside said second surface in alignment with said conductor, and said portion of said elongated conductive member being driven sideways through said insulative member to make said electrical contact with said conductor.

9. A method as claimed in claim 8, in which said conductive member is driven into the insulative member by means of a tool member having a driving surface which engages against a portion of said conductive member for driving it into the insulative material, said conductive member extending beyond opposed edges of said driving surface, said driving surface forming an opening in said insulative material and causing said material to deform at the edges of said opening so as to flow around and embed two regions of the conductive member at opposed edge regions of said opening, and thereafter withdrawing said tool member from said opening.

10. A method as claimed in claim 9, including the steps of providing an opening through said insulative member between said first and second surfaces thereof at a point spaced from said electrical contact, and positioning said elongated conductive member through said opening prior to driving said elongated conductive member to make said electrical contact.

11. A method as claimed in claim 9, in which said driving surface of the tool member comprises a substantially flat area which forms said portion of the conductive member into a substantially straight elongated configuration in contact with said conductor.

12. A method as claimed in claim 8, in which said conductor comprises a plurality of conductive particles held by a binder and providing conductivity in said conductor by means of interparticulate physical contacts, said elongated conductive member being driven so as to become embedded in said particles of the conductor.

13. A method as claimed in claim 1, in which said conductor is carried on a surface of said insulative member, said conductive member being positioned alongside said surface and across said conductor, and two portions of said conductive member being driven sideways into said insulative member at positions flanking said conductor.

14. A method as claimed in claim 1, in which said conductor is carried on a surface of said insulative member, including the step of providing an opening in said insulative member from said surface at one side of said conductor, hooking a region of said conductive member in said opening, and positioning a portion of said conductive member across said conductor, a portion of said conductive member being driven sideways into the insulative member at the other side of said conductor.

15. A method as claimed in claim 1, in which said elongated conductive member comprises a lead-in wire of a photoflash lamp and which extends from a bulb of the lamp, and in which said insulative member comprises a circuit board having first and second opposed surfaces and carrying said conductor on said first surface and having an opening therethrough between said surfaces at a point spaced from said electrical contact, said method including the steps of inserting said lead-in wire through said opening from said first surface of the circuit board, positioning a portion of said lead-in wire alongside said second surface of the circuit board in alignment with said conductor, said portion of the lead-in wire being driven sideways through said circuit board to make said electrical contact with said conductor.

16. A method as claimed in claim 5, in which said portion of the lead-in wire is driven through the circuit board by means of a tool member having a driving surface which engages against said portion of the lead-in wire for driving it through said circuit board, said lead-in wire extending beyond opposed edges of said driving surface, said driving surface forming an opening in said circuit board and causing the material thereof to deform at the edges of said opening so as to flow around and embed two regions of the lead-in wire at opposed edge regions of said opening, and thereafter withdrawing said tool member from said opening.

17. A method as claimed in claim 16, in which said tool member is vibrated at an ultrasonic frequency.

18. A method as claimed in claim 16, in which said tool member is heated.

19. A method as claimed in claim 16, in which said driving surface of the tool member comprises a substantially flat area which forms said portion of the conductive member into a substantially straight elongated configuration in contact with said conductor.

20. A method as claimed in claim 15, in which said conductor comprises a plurality of conductive particles held by a binder and providing conductivity in said conductor by means of interparticulate physical contacts, said elongated conductive member being driven so as to become embedded in said particles of the conductor.

* * * * *